US012068031B2

(12) United States Patent
Deguchi et al.

(10) Patent No.: US 12,068,031 B2
(45) Date of Patent: Aug. 20, 2024

(54) SEMICONDUCTOR STORAGE DEVICE

(71) Applicant: Kioxia Corporation, Tokyo (JP)

(72) Inventors: Jun Deguchi, Kawasaki Kanagawa (JP); Daisuke Miyashita, Kawasaki Kanagawa (JP); Atsushi Kawasumi, Fujisawa Kanagawa (JP); Hidehiro Shiga, Yokohama Kanagawa (JP); Shinji Miyano, Yokohama Kanagawa (JP); Shinichi Sasaki, Ota Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 163 days.

(21) Appl. No.: 17/901,239

(22) Filed: Sep. 1, 2022

(65) Prior Publication Data

US 2023/0307052 A1    Sep. 28, 2023

(30) Foreign Application Priority Data

Mar. 22, 2022   (JP) ................. 2022-046059

(51) Int. Cl.
*G11C 16/08*   (2006.01)
*G11C 8/08*    (2006.01)
*G11C 8/10*    (2006.01)

(52) U.S. Cl.
CPC ............ *G11C 16/08* (2013.01); *G11C 8/08* (2013.01); *G11C 8/10* (2013.01)

(58) Field of Classification Search
CPC .............. G11C 8/08; G11C 8/10; G11C 16/08
See application file for complete search history.

(56) References Cited

U.S. PATENT DOCUMENTS 6,424,589 B2 * 7/2002 Mochida .................. G11C 8/08
                                                    365/189.11
6,714,478 B2 * 3/2004 Tomita ..................... G11C 8/14
                                                    365/230.06
(Continued)

FOREIGN PATENT DOCUMENTS

JP       5992577 B2    9/2016
JP       6258436 B2    1/2018
(Continued)

OTHER PUBLICATIONS

Po-Hao Tseng, et al., "In-Memory-Searching Architecture Based on 3D-NAND Technology with Ultra-high Parallelism" 2020 IEEE International Electron Devices Meeting (IEDM), San Francisco, CA, USA, Dec. 12-18, 2020, DOI: 10.1109/IEDM13553.2020.9372035.

*Primary Examiner* — Son L Mai
(74) *Attorney, Agent, or Firm* — Foley & Lardner LLP

(57) ABSTRACT

A semiconductor storage device includes a memory cell array including a plurality of word line groups and a plurality of blocks corresponding to the plurality of word line groups. Each of word line groups includes a plurality of word lines and each of the blocks includes a plurality of memory cells. The plurality of memory cells of each block are connected to the respective word lines of a corresponding one of the word line groups. The semiconductor storage device includes a row decoder including a plurality of word line group decoders corresponding to the plurality of word line groups, respectively. Each of the plurality of word line group decoders is configured to drive a word line independent from a word line driven in another of the word line groups, when all of the plurality of word line groups are activated in parallel.

7 Claims, 14 Drawing Sheets

(56) References Cited

U.S. PATENT DOCUMENTS

| | | | |
|---|---|---|---|
| 7,403,444 B2 * | 7/2008 | Fujiwara | G11C 8/08 365/230.06 |
| 8,400,846 B2 * | 3/2013 | Chu | G11C 29/18 365/220 |
| 8,908,408 B2 | 12/2014 | Tatsumura et al. | |
| 9,262,500 B2 | 2/2016 | Kinoshita et al. | |
| 10,579,683 B2 | 3/2020 | Marukame et al. | |
| 10,831,772 B2 | 11/2020 | Anerousis et al. | |
| 2018/0211706 A1 | 7/2018 | Haibi et al. | |

FOREIGN PATENT DOCUMENTS

| | | |
|---|---|---|
| JP | 2018-121243 A | 8/2018 |
| JP | 2021-508391 A | 3/2021 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2022-046059, filed Mar. 22, 2022, the entire contents of which are incorporated herein by reference.

FIELD

Embodiments described herein relate generally to a semiconductor storage device.

BACKGROUND

Generally, a semiconductor storage device includes a plurality of word line groups, a memory cell array, and a row decoder that are connected to the plurality of word line groups. In such a semiconductor storage device, the row decoder can activate the word line groups to control the memory cell array. In this regard, it is desirable to appropriately control the memory cell array through the word line groups.

DETAILED DESCRIPTION

Embodiments provide a semiconductor storage device capable of appropriately controlling a memory cell array.

In general, according to one embodiment, a semiconductor storage device includes a memory cell array including a plurality of word line groups and a plurality of blocks corresponding to the plurality of word line groups. Each of word line groups includes a plurality of word lines and each of the blocks includes a plurality of memory cells. The plurality of memory cells of each block are connected to the respective word lines of a corresponding one of the word line groups. The semiconductor storage device includes a row decoder including a plurality of word line group decoders corresponding to the plurality of word line groups, respectively. Each of the plurality of word line group decoders is configured to drive a word line independent from a word line driven in another of the word line groups, when all of the plurality of word line groups are activated in parallel.

Hereinafter, a semiconductor storage device according to an embodiment will be described in detail with reference to the accompanying drawings. The present disclosure is not limited to the embodiment.

Embodiment

A semiconductor storage device according to an embodiment includes a memory cell array and a row decoder. The memory cell array includes a plurality of blocks. The plurality of blocks are connected to a plurality of different word line groups, respectively. Each word line group includes a plurality of word lines. Each block is connected to a row decoder via the word line group. The row decoder activates the word line group and selectively drives a certain word line in the activated word line group. Accordingly, a selected memory cell in a certain block of the memory cell array can be accessed.

The row decoder may activate the plurality of word line groups in parallel. At this time, if only a corresponding word line can be selectively driven among the plurality of word line groups, flexibility in controlling the memory cell array is limited. Depending on contents of a command for the semiconductor storage device, the memory cell array cannot be appropriately controlled.

Therefore, in the present embodiment, in the semiconductor storage device, a row decoder including a plurality of word line group decoders is provided. Each word line group decoder can selectively drive different word lines in the word line group when the plurality of word line groups are activated in parallel. Accordingly, an object is to improve the flexibility in controlling the memory cell array.

Figure 1:
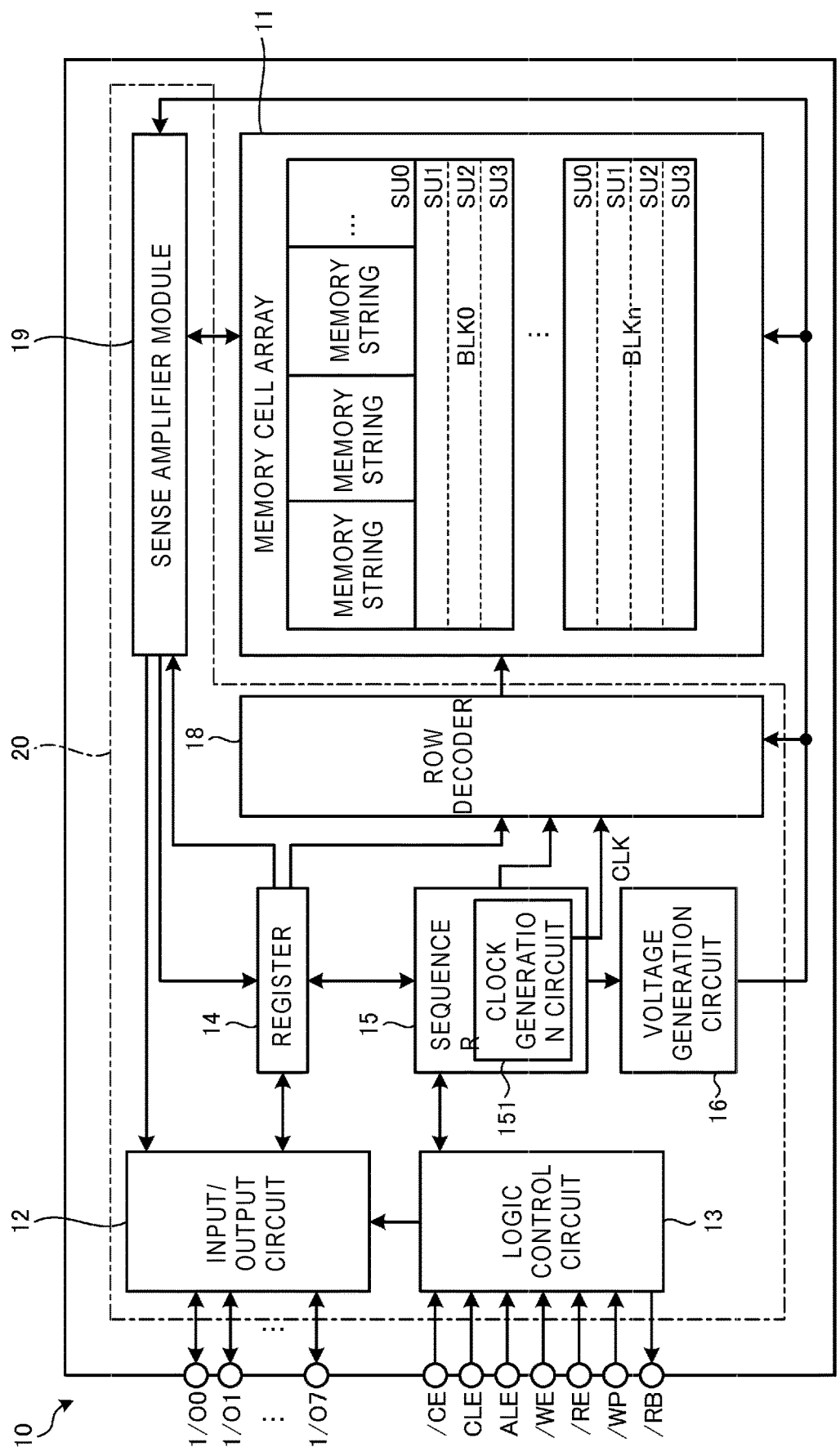
FIG. 1 is a diagram illustrating a configuration of a semiconductor storage device according to an embodiment.

Specifically, a semiconductor storage device 10 can be configured as illustrated in FIG. 1. FIG. 1 is a diagram illustrating a configuration of the semiconductor storage device 10.

The semiconductor storage device 10 includes a memory cell array 11 and a peripheral circuit 20. The semiconductor storage device 10 is, for example, a NAND flash memory. The peripheral circuit 20 includes an input/output circuit 12, a logic control circuit 13, a register 14, a sequencer 15, a voltage generation circuit 16, a row decoder 18, and a sense amplifier module 19.

Figure 2:
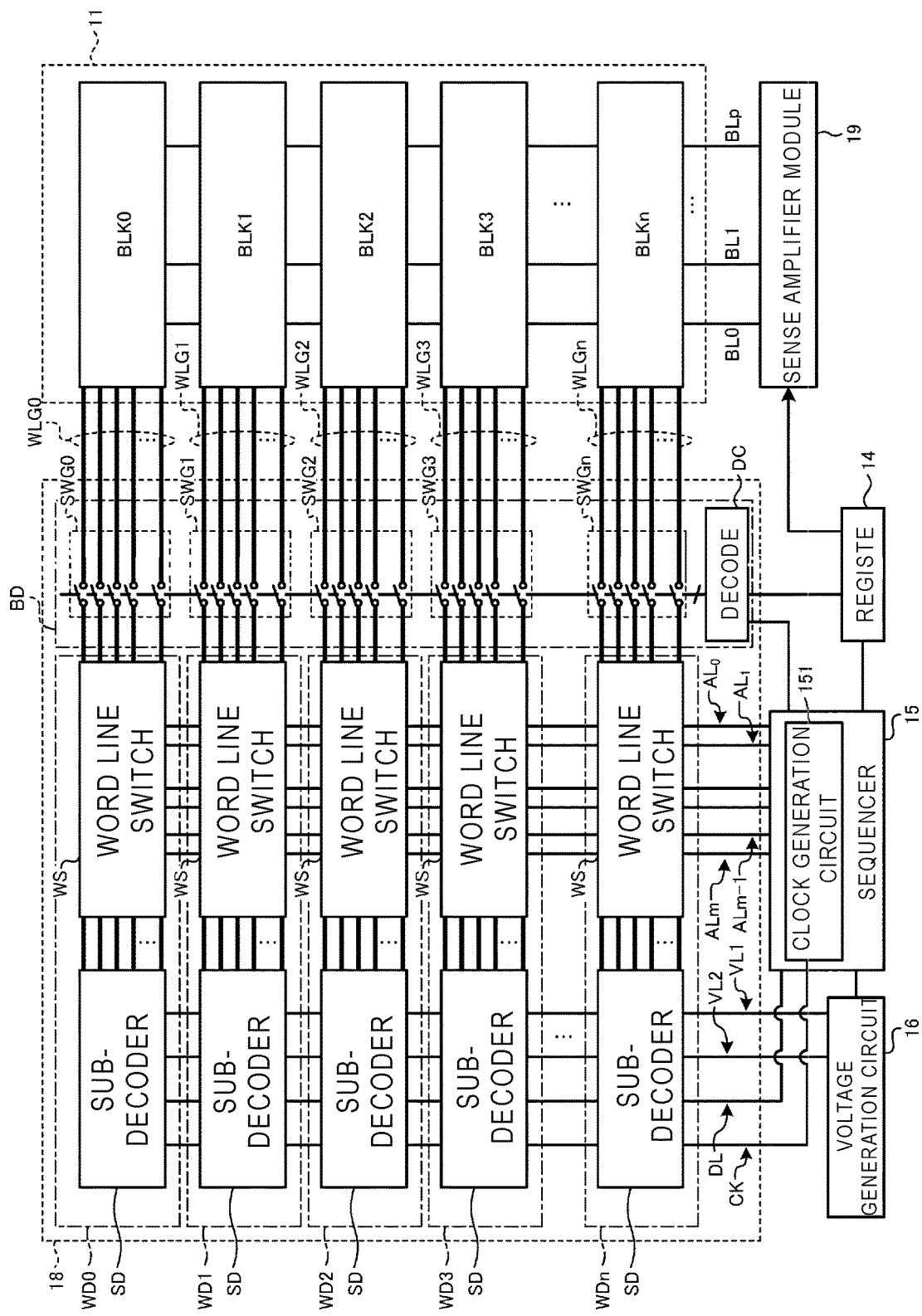
FIG. 2 is a diagram illustrating a configuration of a row decoder and a memory cell array according to the embodiment.

As illustrated in FIGS. 1 and 2, the memory cell array 11 includes a plurality of word line groups WLG0 to WLGn (n is an integer of two or more), a plurality of bit lines BL0 to BLp (p is an integer of two or more), and a plurality of blocks BLK0 to BLKn. FIG. 2 is a diagram illustrating a configuration of the row decoder 18 and the memory cell array 11.

The plurality of word line groups WLG0 to WLGn are electrically connected between the row decoder 18 and the memory cell array 11. The plurality of word line groups WLG0 to WLGn and the plurality of blocks BLK0 to BLKn correspond to each other. Each block BLK is connected to the row decoder 18 via a corresponding word line group WLG. The block BLK0 is connected to the row decoder 18 via the word line group WLG0. The block BLKn is connected to the row decoder 18 via the word line group WLGn.

Figure 3:
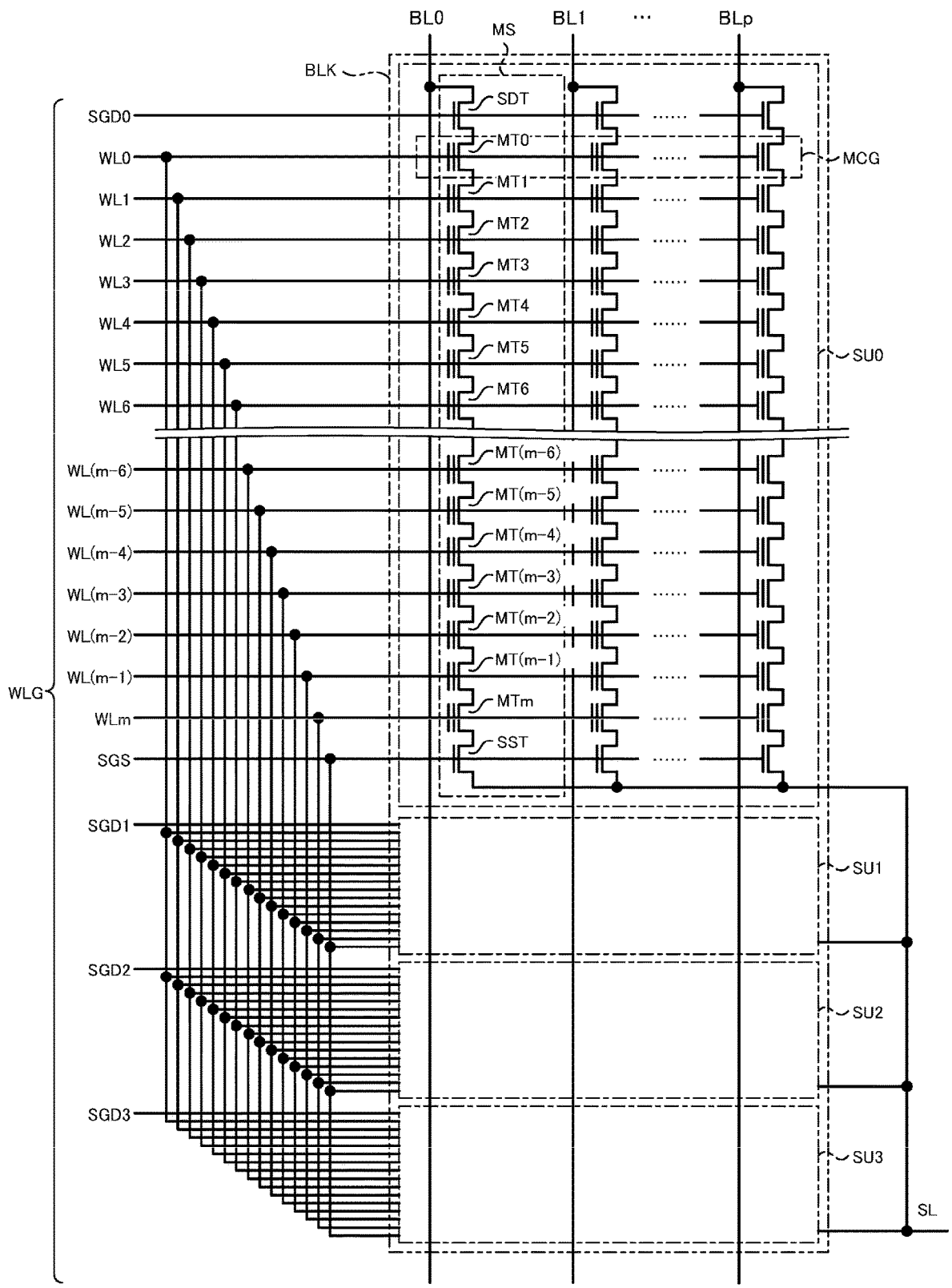
FIG. 3 is a circuit diagram illustrating a configuration of a block according to the embodiment.

Each block BLK can be configured as illustrated in FIG. 3. FIG. 3 is a circuit diagram illustrating a configuration example of one block BLK. Hereinafter, a memory cell MT may be referred to as a memory cell transistor MT.

Each block BLK includes a plurality of string units SU0 to SU3. The plurality of string units SU0 to SU3 correspond to drain side select gate lines SGD0 to SGD3 respectively and share a source side select gate line SGS. The string units SU0 to SU3 can be selectively accessed by the drain side select gate lines SGD0 to SGD3, respectively. Each of the string units SU0 to SU3 includes a plurality of memory strings MS.

Each of the memory strings MS includes, for example, (m+1) memory cell transistors MT (MT0 to MTm) and select transistors SDT and SST. Here, m is an integer of two or more. Each of the memory cell transistors MT includes a control gate and a charge storage film, and stores data in a nonvolatile manner. The (m+1) memory cell transistors MT (MT0 to MTm) are connected in series between a source of the select transistor SDT and a drain of the select transistor SST.

The bit lines BL0 to BLp (denoted by BL when the bit lines are not distinguished from each other) are connected to different memory strings MS, respectively. When the select transistor SDT is turned on, a channel region of each memory cell transistor MT in the memory string MS can be electrically connected to the bit line BL. Each bit line BL is connected with a corresponding sense amplifier among a plurality of sense amplifiers provided in the sense amplifier module 19.

Word lines WL0 to WLm (denoted by WL when the word lines are not distinguished from each other) commonly connect the control gates of the memory cell transistors MT between the memory strings MS in each string unit SU of a physical block BLK. That is, the control gates of the memory cell transistors MT in the same row in each string unit SU of the physical block BLK are connected to the same word line WL. That is, the string unit SU of the physical block BLK includes a plurality of memory cell groups MCG corresponding to the plurality of word lines WL. Each memory cell group MCG includes (p+1) memory cell transistors MT connected to the same word line WL. When a one-bit value can be stored in each memory cell transistor MT (when operating in a single-level cell (SLC) mode), the (p+1) memory cell transistors MT (that is, the memory cell groups MCG) connected to one memory cell group MCG are handled as one physical page, and data write processing and data read processing are performed for each physical page. The data is erased for each block BLK.

A line group including the drain side select gate lines SGD0 to SGD3, the word lines WL0 to WLm, and the source side select gate line SGS constitutes the word line group WLG.

A multi-bit value may be stored in each memory cell transistor MT. For example, when each memory cell transistor MT can store a k-bit value (k is an integer of two or more), a storage capacitance per memory cell group MCG is equal to a size of k physical pages. That is, each memory cell group MCG is handled as k physical pages. For example, in a multi-level cell (MLC) mode in which each memory cell transistor MT stores a two-bit value, data of two physical pages is stored in each memory cell group MCG. Alternatively, in a triple-level cell (TLC) mode in which each memory cell transistor MT stores a three-bit value, data of three physical pages is stored in each memory cell group MCG.

FIG. 3 illustrates a configuration in which the memory cell array 11 includes a plurality of memory cells MT in a three-dimensional array, but when the memory cell array 11 includes a plurality of memory cells MT in a two-dimensional array, the string units SU1 to SU3 may be omitted, and the drain side select gate lines SGD1 to SGD3 may be omitted.

Returning to FIG. 1, the input/output circuit 12 transmits and receives a signal I/O <7:0> (I/O 0 to I/O 7) to and from an external controller (not illustrated). The signal I/O <7:0> is, for example, an eight-bit signal. The signal I/O <7:0> is a signal transmitted and received between the semiconductor storage device 10 and the external controller, and includes a command, an address, and data. The data includes, for example, write data and read data. The input/output circuit 12 transfers the command and the address of the signal I/O to the register 14. The input/output circuit 12 transmits and receives the write data and the read data to and from the sense amplifier module 19.

The logic control circuit 13 receives signals /CE, CLE, ALE, /WE, /RE, and /WP from the external controller. The logic control circuit 13 notifies the external controller of a state of the semiconductor storage device 10 by a signal /RB. The signal /CE is a signal for enabling the semiconductor storage device 10. The signal CLE notifies the semiconductor storage device 10 that the signal I/O <7:0> transmitted to the semiconductor storage device 10 when the signal CLE is at a "High (H)" level is a command. The signal ALE notifies the semiconductor storage device 10 that the signal I/O <7:0> transmitted to the semiconductor storage device 10 when the signal ALE is at the "H" level is an address. The signal /WE instructs the semiconductor storage device 10 to take in the signal I/O <7:0> transmitted to the semiconductor storage device 10 in response to transition of the signal /WE between the "H (High)" level and a "Low (L)" level. The signal /RE instructs the semiconductor storage device 10 to output the signal I/O <7:0>. The signal /WP instructs the semiconductor storage device 10 to prohibit data writing and erasing. The signal /RB indicates whether the semiconductor storage device 10 is in a ready state (a state in which an instruction from an outside is received) or a busy state (a state in which the instruction from the outside is not received).

The register 14 stores the command and the address. The register 14 transfers the address to the row decoder 18 and the sense amplifier module 19, and transfers the command to the sequencer 15.

The sequencer 15 receives the command and controls the entire semiconductor storage device 10 according to a sequence based on the received command. The sequencer 15 includes a clock generation circuit 151. The clock generation circuit 151 generates a clock signal CLK and supplies the clock signal CLK to the row decoder 18.

The voltage generation circuit 16 generates a voltage necessary for operations such as writing, reading, and erasing of data based on an instruction from the sequencer 15. The voltage generation circuit 16 supplies the generated voltage to the row decoder 18, the memory cell array 11, and the sense amplifier module 19.

The row decoder 18 receives a row address from the register 14, and can control the memory cell array 11 in units of rows based on the row address. The row address includes a block address and a page address. The row decoder 18 selectively drives a selected word line WL connected to a selected memory cell MT. In an access operation to the memory cell MT, the row decoder 18 supplies a selected voltage Vr to the selected word line WL among the plurality of word lines WL, and supplies a non-selected voltage Vp to a non-selected word line WL.

When the access operation is a read operation, the selected voltage Vr is a read voltage, and the non-selected voltage Vp is a transfer voltage. The read voltage is a gate voltage for detecting a threshold value of the selected memory cell MT, and the transfer voltage is a gate voltage for turning on a non-selected memory cell MT. When the access operation is a write operation, the selected voltage Vr is a program voltage, and the non-selected voltage Vp is a transfer voltage. The program voltage is a voltage for storing charges in the charge storage film of the selected memory cell MT, and the transfer voltage is a gate voltage for turning on the non-selected memory cell MT.

As illustrated in FIG. 2, the row decoder 18 includes a block decoder BD and a plurality of word line group decoders WD0 to WDn.

The block decoder BD is electrically connected between the plurality of word line group decoders WD0 to WDn and the plurality of blocks BLK0 to BLKn. The block decoder BD is disposed across the plurality of word line groups WLG0 to WLGn, and is disposed across the plurality of blocks BLK0 to BLKn. The block decoder BD includes a decoder DC and a plurality of switch groups SWG0 to SWGn. The decoder DC is electrically connected to the register 14, the sequencer 15, and the plurality of switch groups SWG0 to SWGn. The plurality of switch groups SWG0 to SWGn correspond to the plurality of word line groups WLG0 to WLGn, and correspond to the plurality of blocks BLK0 to BLKn. The decoder DC receives and decodes the block address. Each switch group SWG includes m switches, and the m switches are turned on and off collectively according to a decoding result of the decoder DC.

The plurality of word line group decoders WD0 to WDn correspond to the plurality of word line groups WLG0 to WLGn and correspond to the plurality of blocks BLK0 to BLKn. Each word line group decoder WD is electrically connected to a corresponding block BLK via a corresponding word line group WLG and the block decoder BD.

The sense amplifier module 19 includes a column decoder, receives a column address from the register 14, and can control the memory cell array 11 in units of columns based on the column address. In the read operation, the sense amplifier module 19 senses data read from the selected memory cell MT to the bit line BL, and transfers the sensed data to the input/output circuit 12.

The semiconductor storage device 10 has a first mode and a second mode as operation modes. The first mode is a mode in which one block BLK is accessed, and the second mode is a mode in which a plurality of blocks BLK are accessed in parallel. The sequencer 15 can switch the operation mode of the semiconductor storage device 10 between the first mode and the second mode based on the received command. When it is determined that the operation should be performed in the first mode in response to the command, the sequencer 15 controls the row decoder 18 and the sense amplifier module 19 in the first mode. When it is determined that the operation should be performed in the second mode in response to the command, the sequencer 15 controls the row decoder 18 and the sense amplifier module 19 in the second mode.

In the first mode, the register 14 supplies the block address in the row address to the decoder DC of the block decoder BD, and supplies the page address in the row address to the sequencer 15. The sequencer 15 generates a plurality of data signals and a plurality of address signals according to the page address, and supplies the plurality of data signals and the plurality of address signals to the plurality of word line group decoders WD0 to WDn. The block decoder BD maintains a switch group SWG corresponding to a block BLK designated by the block address among the plurality of blocks BLK0 to BLKn in an on state, and maintains the other switch groups SWG in an off state. Accordingly, a word line group WLG corresponding to the block BLK designated by the block address is selectively activated. A corresponding word line group decoder WD among the plurality of word line group decoders WD0 to WDn selectively drives a word line corresponding to the page address among the plurality of word lines WL in the word line group WLG. Accordingly, a memory cell MT designated by the page address in the block BLK can be accessed.

In the second mode, the register 14 supplies the row address to the sequencer 15. The sequencer 15 generates an all-selected block address and supplies the all-selected block address to the decoder DC of the block decoder BD, regardless of the block address in the row address. At the same time, the sequencer 15 generates a plurality of address signals according to the page address in the row address, and supplies the generated address signals to the plurality of word line group decoders WD0 to WDn. The block decoder BD maintains the plurality of (all) switch groups SWG0 to SWGn corresponding to the plurality of blocks BLK0 to BLKn in the on state. Accordingly, the plurality of (all) word line groups WLG0 to WLGn corresponding to the plurality of blocks BLK0 to BLKn are activated in parallel.

Figure 4A:
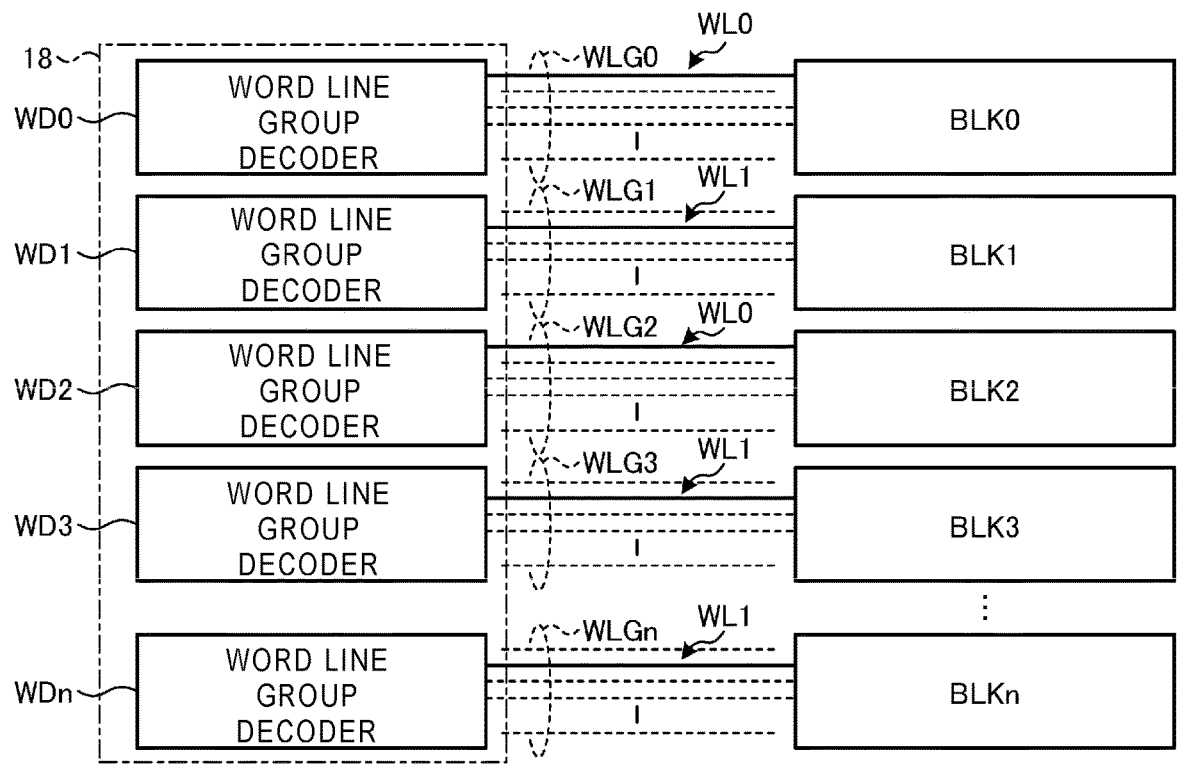
FIGS. 4A and 4B are diagrams illustrating operations of a plurality of word line group decoders according to the embodiment.
Figure 4B:
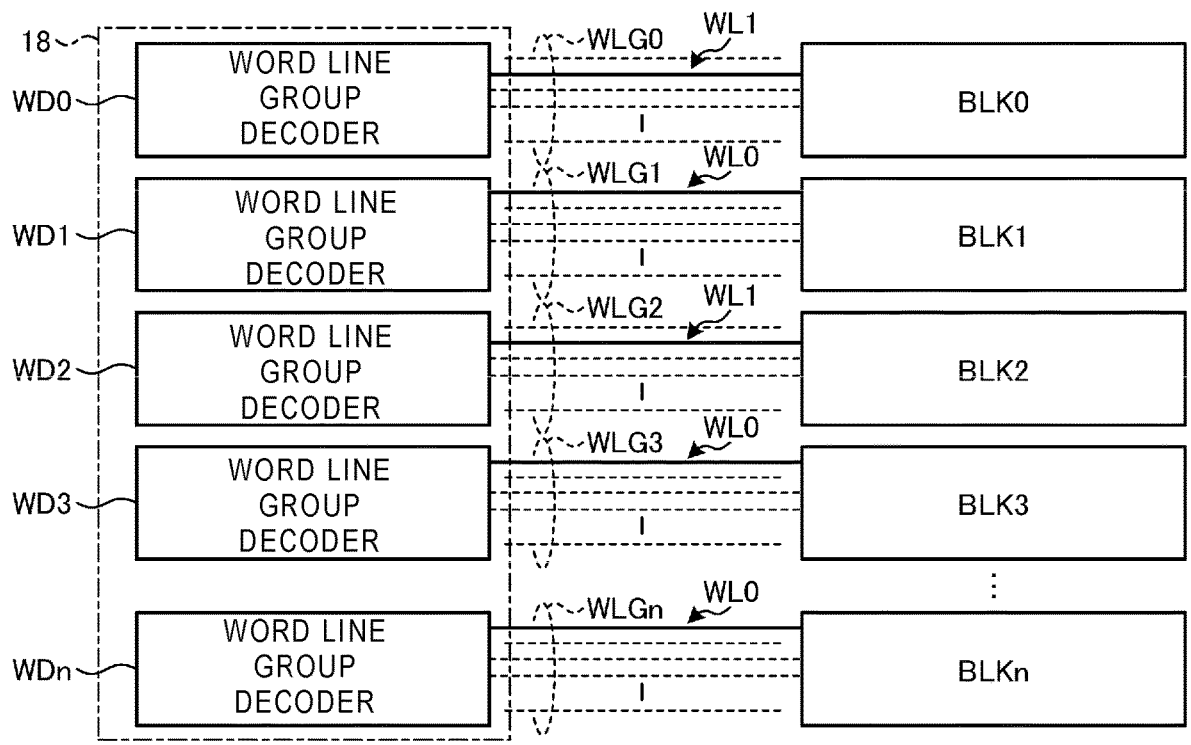

At this time, the plurality of word line group decoders WD0 to WDn can selectively drive different word lines in the word line group WLG according to the plurality of address signals. For example, as illustrated in FIGS. 4A and 4B, a selected word line WL that is selectively driven when the plurality of word line groups WLG0 to WLGn are activated in parallel is indicated by a solid line, and non-selected word lines WL that are not selectively driven are indicated by dotted lines. FIGS. 4A and 4B are diagrams illustrating operations of the plurality of word line group decoders WD0 to WDn in the second mode.

For example, in a first period, the row decoder 18 can operate as illustrated in FIG. 4A. The word line group decoders WD0 and WD2 among the plurality of word line group decoders WD0 to WDn selectively drive the word lines WL0, apply the selected voltages Vr to the word lines WL0, and apply the non-selected voltages Vp to the remaining word lines WL1 to WLm, respectively. The word line group decoders WD1, WD3, and WDn selectively drive the word lines WL1, apply the selected voltages Vr to the word lines WL1, and apply the non-selected voltages Vp to the word lines WL0 and the remaining word lines WL2 to WLm, respectively. The word lines WL0 and WL1 in each of the word line groups WLG0 to WLGn correspond to each other. The word line WL1 in each of the word line groups WLG0 to WLGn is a word line adjacent to a corresponding word line WL0.

In a second period, the row decoder 18 can operate as illustrated in FIG. 4B. The word line group decoders WD1, WD3, and WDn among the plurality of word line group decoders WD0 to WDn selectively drive the word lines WL0, apply the selected voltages Vr to the word lines WL0, and apply the non-selected voltages Vp to the remaining word lines WL1 to WLm, respectively. The word line group decoders WD0 and WD2 selectively drive the word lines WL1, apply the selected voltages Vr to the word lines WL1, and apply the non-selected voltages Vp to the word lines WL0 and the remaining word lines WL2 to WLm, respectively.

That is, the row decoder 18 can selectively drive different word lines among the plurality of word line groups WLG0 to WLGn when the plurality of word line groups WLG0 to WLGn are activated in parallel. Accordingly, the flexibility in controlling the memory cell array 11 can be improved, and the memory cell array 11 can be appropriately controlled depending on the contents of the command for the semiconductor storage device 10.

Next, a configuration of the row decoder 18 will be specifically described. As illustrated in FIG. 2, in the row decoder 18, each word line group decoder WD includes a sub-decoder circuit SD and a word line switch circuit WS. Each word line switch circuit WS is electrically connected between a corresponding sub-decoder circuit SD and the block decoder BD. Each sub-decoder circuit SD of the plurality of word line group decoders WD0 to WDn is connected to the voltage generation circuit 16 via common voltage lines VL1 and VL2, is connected to the clock generation circuit 151 via a common clock line CK, and is connected to the sequencer 15 via a common data line DL. Each word line switch circuit WS of the plurality of word line group decoders WD0 to WDn is connected to the sequencer 15 via common address lines $AL_0$ to $AL_m$.

The word line group decoder WD controls the plurality of word lines WL0 to WLm in units of sets every two. In the word line group decoder WD, the word line switch circuit WS selects one set out of a plurality of sets of word lines WL, and the sub-decoder circuit SD selectively drives the word line in the selected set.

Figure 5:
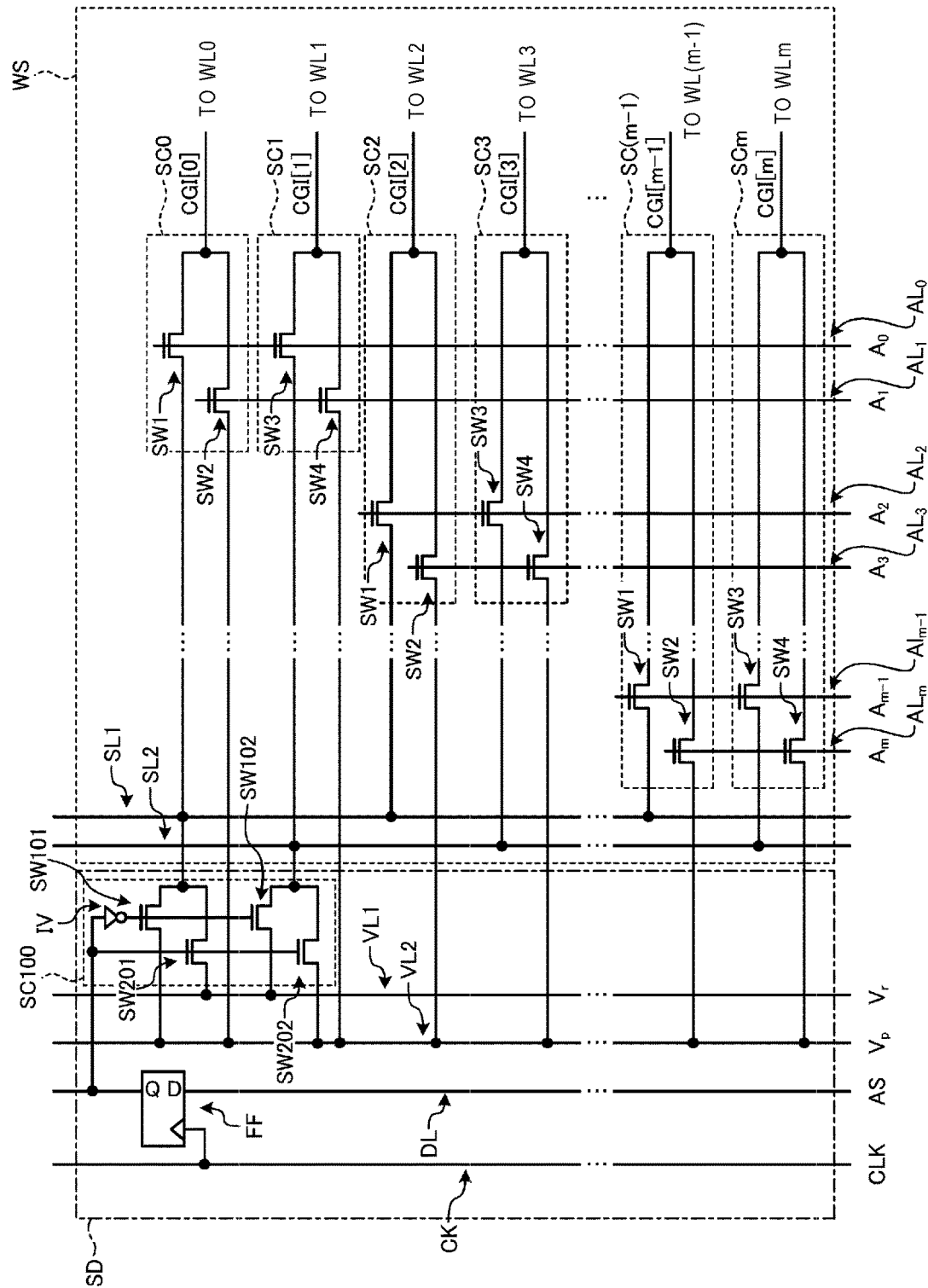
FIG. 5 is a circuit diagram illustrating a configuration of the word line group decoder according to the embodiment.

As illustrated in FIG. 5, the sub-decoder circuit SD includes a flip-flop FF, the voltage line VL1, the voltage line VL2, and a switching circuit SC100. The word line switch circuit WS includes a signal line SL1, a signal line SL2, and a plurality of switching circuits SC0 to SCm. FIG. 5 is a diagram illustrating a configuration of the sub-decoder circuit SD and the word line switch circuit WS.

In the sub-decoder circuit SD, the flip-flop FF stores an address signal AS. The flip-flop FF outputs the stored address signal AS in synchronization with the clock signal CLK. The switching circuit SC100 switches between a first connection state and a second connection state according to a value of the address signal AS output from the flip-flop FF. The first connection state is a state in which the voltage line VL1 is connected to the signal line SL1 and the voltage line VL2 is connected to the signal line SL2. The second connection state is a state in which the voltage line VL1 is connected to the signal line SL2 and the voltage line VL2 is connected to the signal line SL1.

In the word line switch circuit WS, the plurality of switching circuits SC0 to SCm correspond to the plurality of word lines WL0 to WLm. The plurality of switching circuits SC0 to SCm form a set every two. The switching circuits SC0 and SC1 form a set. The switching circuits SC(m−1) and SCm form a set. In response to this set, a plurality of address signals $A_0$ to $A_m$ to be supplied form a set every two. The two address signals $A_1$ and $A_0$ commonly received by the switching circuits SC0 and SC1 form a set. The two address signals $A_m$ and $A_{m-1}$ commonly received by the switching circuits SC(m−1) and SCm form a set.

The set of the two switching circuits SC includes a switching circuit SC corresponding to an even-numbered word line WL and a switching circuit SC corresponding to an odd-numbered word line WL.

Assuming that m is an odd number, the switching circuits SC0, SC2, . . . , SC(m−1) corresponding to the even-numbered word lines WL0, WL2, . . . , WL(m−1) switch between a third connection state and a fourth connection state according to values of the two address signals A. The third connection state is a state in which the signal line SL1 is connected to the word line WL. The fourth connection state is a state in which the voltage line VL2 is connected to the word line WL. The switching circuits SC1, SC3, . . . , SCm corresponding to the odd-numbered word lines WL1, WL3, . . . , WLm switch between a fifth connection state and the fourth connection state. The fifth connection state is a state in which the signal line SL2 is connected to the word line WL.

In the set of the two switching circuits SC, when the two address signals A indicate active values, the even-numbered switching circuit SC in the set switches to the third connection state, and the odd-numbered switching circuit SC in the set switches to the fifth connection state. Accordingly, the word line switch circuit WS selects a set of two word lines WL corresponding to the set of the two switching circuits SC.

Assuming that i is an even number of 0 or more, the two address signals may indicate active values when $(A_{i+1}, A_i)=(0, 1)$, and may indicate non-active values when $(A_{i+1}, A_i)=(1, 0)$.

Each even-numbered switching circuit SCi includes a plurality of switches SW1 and SW2. The switch SW1 includes a first end connected to the signal line SL1, a second end connected to the word line WL, and a control end connected to the address line $AL_i$. The switch SW1 is, for example, a transistor, and the first end, the second end, and the control end are a drain, a source, and a gate, respectively. The switch SW2 includes a first end connected to the voltage line VL2, a second end connected to the word line WL, and a control end connected to the address line $AL_{i+1}$. The switch SW2 is, for example, a transistor, and the first end, the second end, and the control end are a drain, a source, and a gate, respectively. When the address signal $(A_{i+1}, A_i)=(0, 1)$, the even-numbered switching circuit SCi switches to the third connection state by turning on the switch SW1 and turning off the switch SW2. When the address signal $(A_{i+1}, A_i)=(1, 0)$, the even-numbered switching circuit SCi switches to the fourth connection state by turning off the switch SW1 and turning on the switch SW2.

Each odd-numbered switching circuit SC(i+1) include a plurality of switches SW3 and SW4. The switch SW3 includes a first end connected to the signal line SL2, a second end connected to the word line WL, and a control end connected to the address line $AL_i$. The switch SW3 is, for example, a transistor, and the first end, the second end, and the control end are a drain, a source, and a gate, respectively. The switch SW4 includes a first end connected to the voltage line VL2, a second end connected to the word line WL, and a control end connected to the address line $AL_{i+1}$. The switch SW4 is, for example, a transistor, and the first end, the second end, and the control end are a drain, a source, and a gate, respectively. When the address signal $(A_{i+1}, A_i)=(0, 1)$, the odd-numbered switching circuit SC(i+1) switches to the fifth connection state by turning on the switch SW3 and turning off the switch SW4. When the address signal $(A_{i+1}, $A_i$)=(1, 0), the odd-numbered switching circuit SC(i+1) switches to the fourth connection state by turning off the switch SW3 and turning on the switch SW4.

Figure 6:
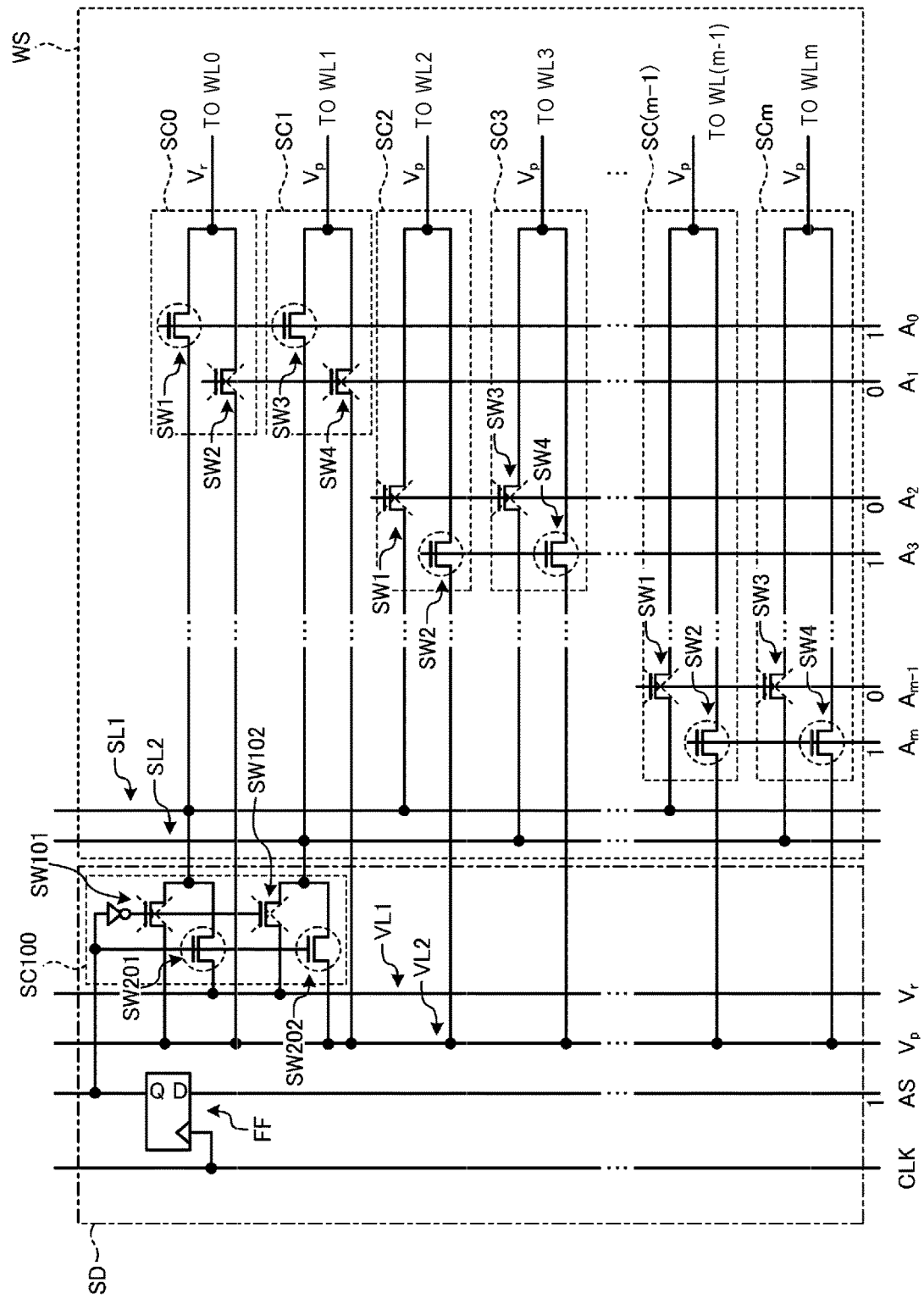
FIG. 6 is a circuit diagram illustrating an example of an operation of the word line group decoder according to the embodiment.
Figure 7:
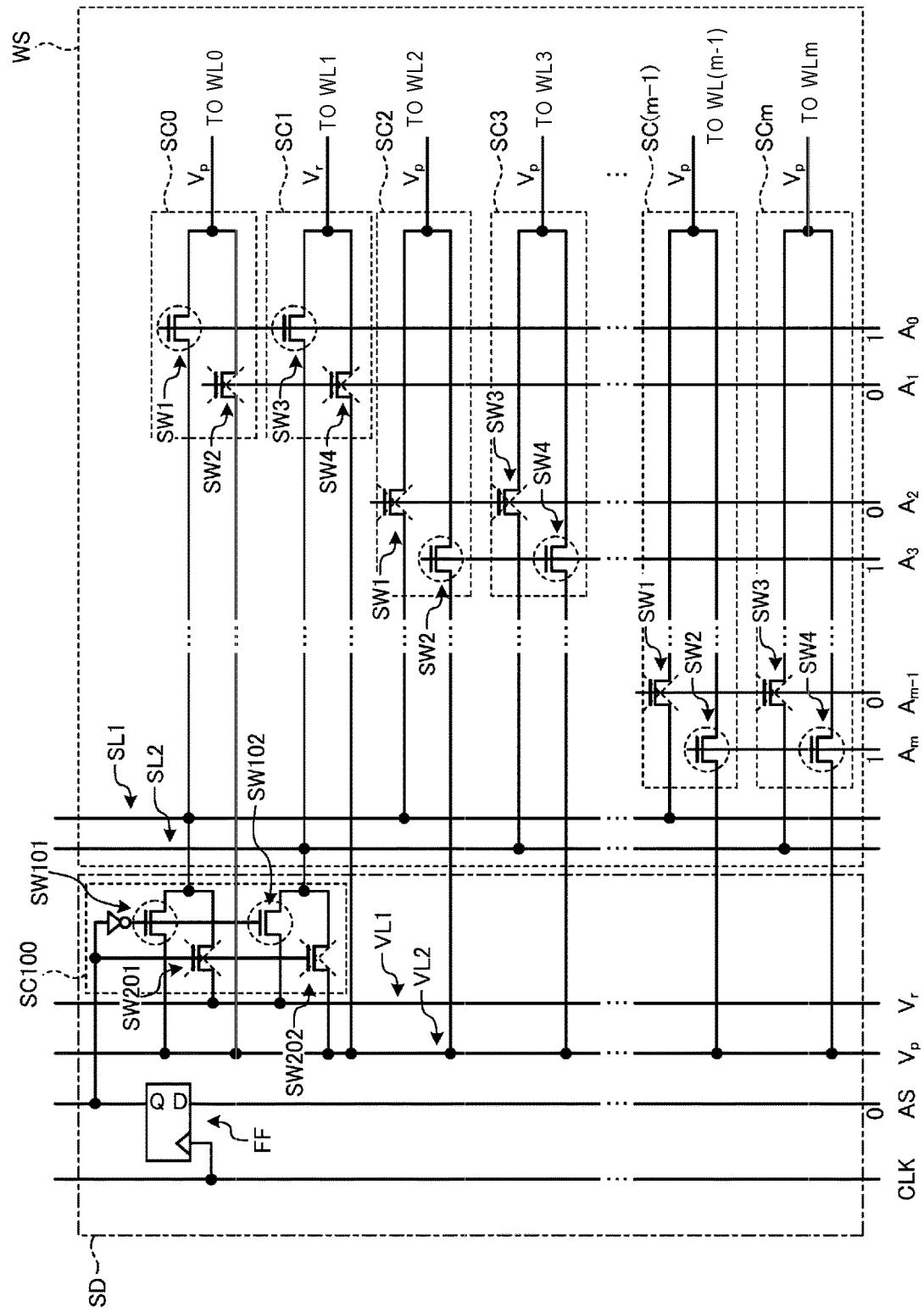
FIG. 7 is a circuit diagram illustrating another example of the operation of the word line group decoder according to the embodiment.

For example, in cases of FIGS. 6 and 7, the switching circuit SC0 switches to the third connection state by turning on the switch SW1 and turning off the switch SW2 when the address signal ($A_1$, $A_0$)=(0, 1). FIGS. 6 and 7 are circuit diagrams illustrating the operations of the word line group decoder WD. The switching circuit SC2 switches to the fourth connection state by turning off the switch SW1 and turning on the switch SW2 when the address signal ($A_3$, $A_2$)=(1, 0). The switching circuit SC(m−1) switches to the fourth connection state by turning off the switch SW1 and turning on the switch SW2 when the address signal ($A_m$, $A_{m-1}$)=(1, 0).

The switching circuit SC1 switches to the fifth connection state by turning on the switch SW3 and turning off the switch SW4 when the address signal ($A_1$, $A_0$)=(0, 1). The switching circuit SC3 switches to the fourth connection state by turning off the switch SW3 and turning on the switch SW4 when the address signal ($A_3$, $A_2$)=(1, 0). The switching circuit SCm switches to the fourth connection state by turning off the switch SW3 and turning on the switch SW4 when the address signal ($A_m$, $A_{m-1}$)=(1, 0).

As illustrated in FIG. 5, in the sub-decoder circuit SD, the flip-flop FF includes a data input node D to which the data line DL is connected, a clock node to which the clock line CK is connected, and a data output node Q to which an inverter IV and switches SW201 and SW202 are connected.

The switching circuit SC100 includes the inverter IV and a plurality of switches SW101, SW102, SW201, and SW202.

The inverter IV includes an input node connected to the data output node Q of the flip-flop FF and control terminals of the switches SW201 and SW202, and an output node connected to control terminals of the switches SW101 and SW102.

The switch SW101 includes a first end connected to the voltage line VL2, a second end connected to the signal line SL1, and a control end connected to the output node of the inverter IV. The switch SW101 is, for example, a transistor, and the first end, the second end, and the control end are a drain, a source, and a gate, respectively.

The switch SW102 includes a first end connected to the voltage line VL1, a second end connected to the signal line SL2, and a control end connected to the output node of the inverter IV. The switch SW102 is, for example, a transistor, and the first end, the second end, and the control end are a drain, a source, and a gate, respectively.

The switch SW201 includes a first end connected to the voltage line VL1, a second end connected to the signal line SL1, and a control end connected to the data output node Q of the flip-flop FF. The switch SW201 is, for example, a transistor, and the first end, the second end, and the control end are a drain, a source, and a gate, respectively.

The switch SW202 includes a first end connected to the voltage line VL2, a second end connected to the signal line SL2, and a control end connected to the data output node Q of the flip-flop FF. The switch SW202 is, for example, a transistor, and the first end, the second end, and the control end are a drain, a source, and a gate, respectively.

The data line DL is serially connected from the sequencer 15 to the flip-flop FF provided in each of the sub-decoder circuits SD of the plurality of word line group decoders WD (see FIG. 8). The clock line CK is connected in parallel from the clock generation circuit 151 to the flip-flop FF provided in each of the sub-decoder circuits SD of the plurality of word line group decoders WD (see FIG. 8). The flip-flops FF of the plurality of sub-decoder circuits SD constitute a shift register. The address signal AS output from the sequencer 15 is sequentially shifted to the flip-flop FF of the word line group decoder WDn, the flip-flop FF of the word line group decoder WD(n−1), . . . , the flip-flop FF of the word line group decoder WD1, and the flip-flop FF of the word line group decoder WD0 in synchronization with the clock signal CLK.

The voltage lines VL1 and VL2 are connected in parallel from the voltage generation circuit 16 to the switching circuit SC100 included in each of the sub-decoder circuits SD of the plurality of word line group decoders WD (see FIG. 8). In the access operation to the memory cell MT, the voltage line VL1 transmits the selected voltage Vr, and the voltage line VL2 transmits the non-selected voltage Vp.

The switching circuit SC100 switches between the first connection state and the second connection state according to the value of the address signal AS output from the flip-flop FF.

For example, in the case of FIG. 6, the switching circuit SC100 switches to the first connection state by turning off the switches SW101 and SW102 and turning on the switches SW201 and SW202 when the address signal AS="1", which is output from the flip-flop FF. Accordingly, the switching circuit SC100 transfers the selected voltage Vr to the signal line SL1 and transfers the non-selected voltage Vp to the signal line SL2. As a result, the sub-decoder circuit SD selectively drives the even-numbered word line WL in the set of the word lines WL. In the case of FIG. 6, the word line WL0 in the set of the word lines WL0 and WL1 is selectively driven. In the first connection state and the fourth connection state, the word line group decoder WD can supply the selected voltage Vr to the word line WL0 and supply the non-selected voltages Vp to the other word lines WL1 to WLm.

In the case of FIG. 7, the switching circuit SC100 switches to the second connection state by turning on the switches SW101 and SW102 and turning off the switches SW201 and SW202 when the address signal AS="0", which is output from the flip-flop FF. Accordingly, the switching circuit SC100 transfers the non-selected voltage Vp to the signal line SL1 and transfers the selected voltage Vr to the signal line SL2. As a result, the sub-decoder circuit SD selectively drives the odd-numbered word lines WL in the set of the word lines WL. In the case of FIG. 7, the word line WL1 in the set of the word lines WL0 and WL1 is selectively driven. In the second connection state and the fourth connection state, the word line group decoder WD can supply the selected voltage Vr to the word line WL1 and supply the non-selected voltages Vp to the other word lines WL0 and WL2 to WLm.

Figure 8A:
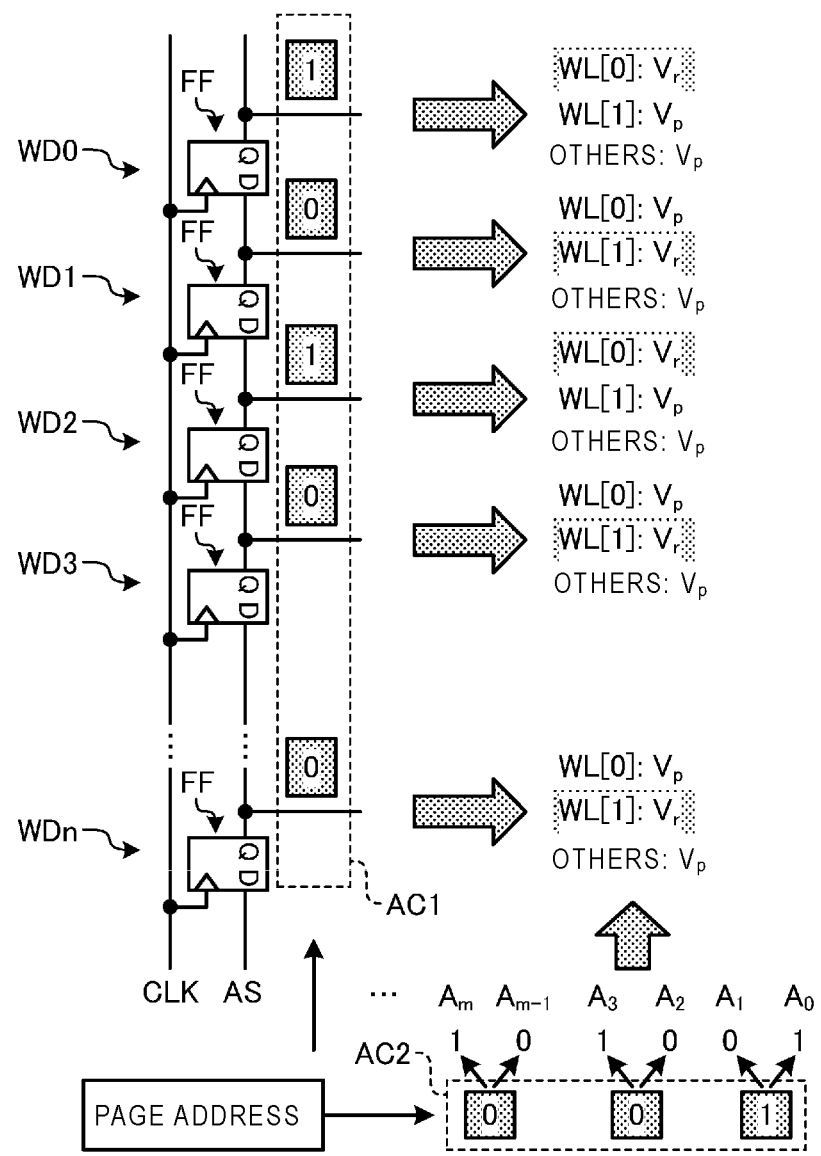
FIGS. 8A and 8B are diagrams illustrating an example of selection driving of a word line according to an address signal according to the embodiment.

In the second mode, the sequencer 15 can generate a plurality of address signals AS and $A_0$ to $A_m$ as illustrated in FIG. 8A according to the page address in the row address. FIG. 8A is a diagram illustrating operations of the plurality of word line group decoders WD0 to WDm according to the plurality of address signals AS and $A_0$ to $A_m$. The sequencer 15 generates an address code AC1 and an address code AC2 according to the page address.

The sequencer 15 performs, on the address code AC2, a first conversion of
 bit value "1"→ address signal ($A_{i+1}$, $A_i$)=(0, 1) and
 bit value "0"→ address signal ($A_{i+1}$, $A_i$)=(1, 0),
generates the plurality of address signals $A_0$ to $A_m$, and
 transfers the generated address signals $A_0$ to $A_m$ to the word line switch circuits WS of the plurality of word line group decoders WD0 to WDn in parallel. In a case of FIG. 8A, the sequencer 15 performs the first conversion on the address code AC2=(0, ..., 0, 1), generates address signals $(A_m, A_{m-1}, \ldots, A_3, A_2, A_1, A_0)$=(1, 0, ..., 1, 0, 0, 1), and transfers the address signals $(A_m, A_{m-1}, \ldots A_3, A_2, A_1, A_0)$=(1, 0, 1, 0, 0, 1) to the word line switch circuits WS of the plurality of word line group decoders WD0 to WDm in parallel. Accordingly, each word line group decoder WD selects the set of the word lines WL0 and WL1 among the plurality of word lines WL0 to WLm in the word line group WLG.

The sequencer 15 serially transfers the address code AC1 from a head bit to the flip-flops FF of the sub-decoder circuits SD of the plurality of word line group decoders WD0 to WDn. Each bit of the address code AC1 constitutes the address signal AS. When the address signal AS is distinguished by subscripts, FIG. 8A illustrates a state in which address signals $(AS_0, AS_1, AS_2, AS_3, \ldots, AS_n)$=(1, 0, 1, 0, ..., 0) are output from the flip-flops FF of the plurality of word line group decoders WD0, WD1, WD2, WD3, WDn. Accordingly, the word line group decoders WD0 and WD2 corresponding to the address signal AS of the bit value "1" selectively drive the word line WL0 in the set, and the word line group decoders WD1, WD3, and WDn corresponding to the address signal AS of the bit value "0" selectively drive the word line WL1 in the set. As a result, for example, in the first period, the operations of the plurality of word line group decoders WD0 to WDn as illustrated in FIG. 4A can be executed.

Figure 8B:
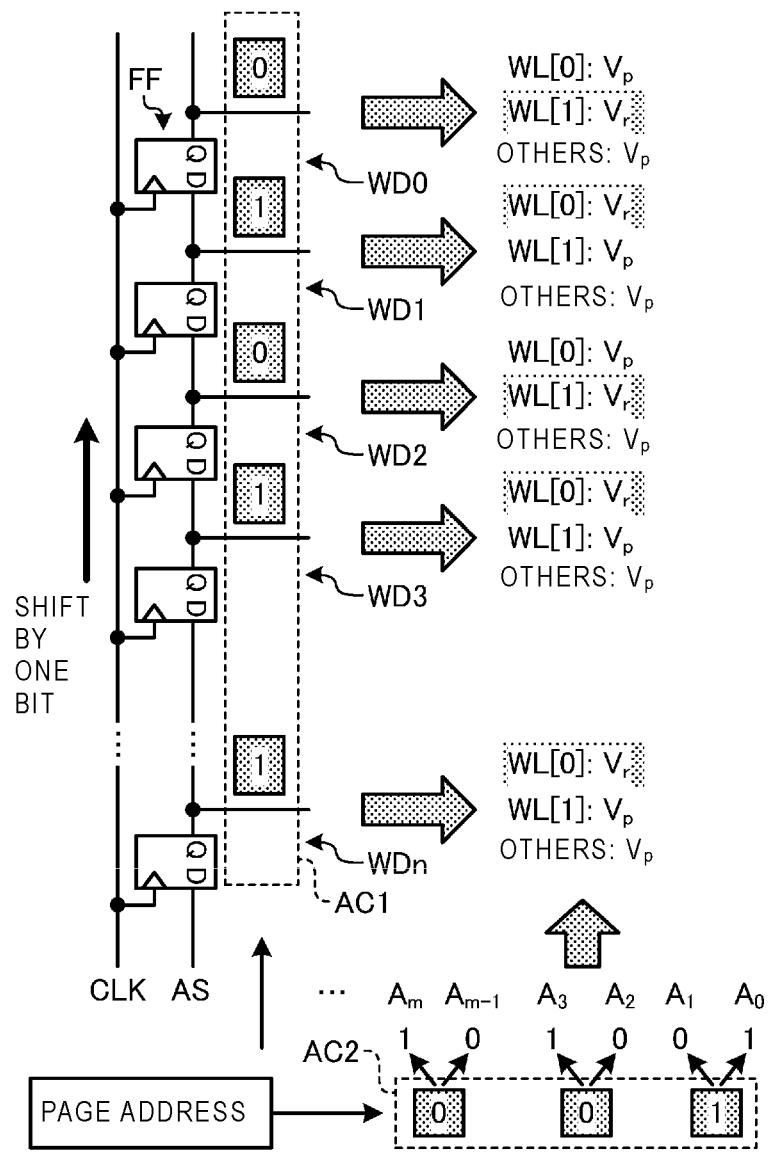

When the address signal AS is shifted by one bit between the flip-flops FF of the plurality of word line group decoders WD0 to WDn in synchronization with the clock signal CLK, the state illustrated in FIG. 8A can be transited to a state illustrated in FIG. 8B. FIG. 8B illustrates a state in which address signals $(AS_0, AS_1, AS_2, AS_3, \ldots, AS_n)$=(0, 1, 0, 1, ..., 1) are output from the flip-flops FF of the plurality of word line group decoders WD0, WD1, WD2, WD3, WDn. Accordingly, the word line group decoders WD1, WD3, and WDn corresponding to the address signal AS of the bit value "1" selectively drive the word line WL0 in the set, and the word line group decoders WD0 and WD2 corresponding to the address signal AS of the bit value "0" selectively drive the word line WL1 in the set. As a result, for example, in the second period, the operations of the plurality of word line group decoders WD0 to WDn as illustrated in FIG. 4B can be executed.

Figure 9A:
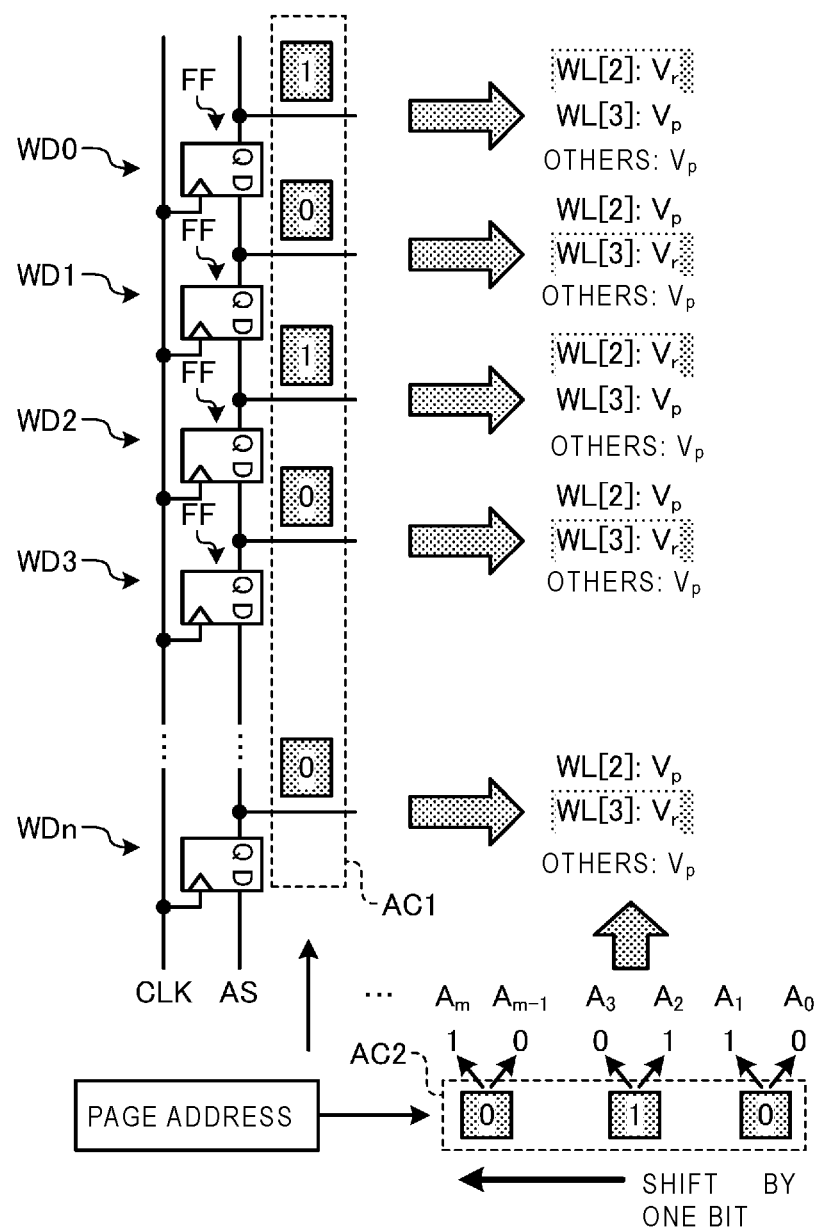
FIGS. 9A and 9B are diagrams illustrating another example of the selection driving of the word line according to the address signal according to the embodiment.

As illustrated in FIG. 9A, the sequencer 15 may shift the address code AC2 illustrated in FIG. 8A by one bit. In a case of FIG. 9A, the sequencer 15 performs the first conversion on the address code AC2=(0, ..., 1, 0) shifted by one bit, generates address signals $(A_m, A_{m-1}, \ldots, A_3, A_2, A_1, A_0)$=(1, 0, ..., 0, 1, 1, 0), and transfers the address signals $(A_m, A_{m-1}, \ldots, A_3, A_2, A_1, A_0)$=(1, 0, ..., 0, 1, 1, 0) to the word line switch circuits WS of the word line group decoders WD in parallel. Accordingly, each word line group decoder WD selects a set of the word lines WL2 and WL3 among the plurality of word lines WL0 to WLm in the word line group WLG.

Figure 10A:
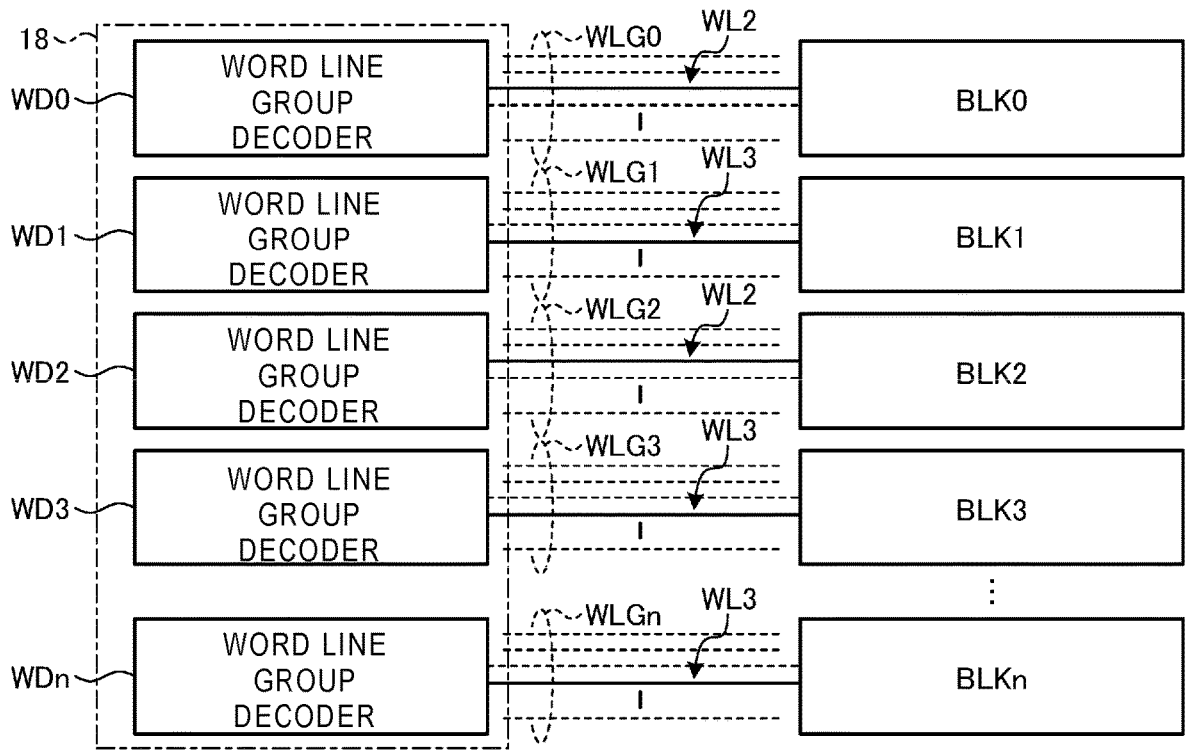
FIGS. 10A and 10B are diagrams illustrating other operations of the plurality of word line group decoders according to the embodiment.

The sequencer 15 serially transfers the address code AC1 from the head bit to the flip-flops FF of the sub-decoder circuits SD of the plurality of word line group decoders WD0 to WDn. FIG. 9A illustrates a state in which the address signals $(AS_0, AS_1, AS_2, AS_3, \ldots, AS_n)$=(1, 0, 1, 0, ..., 0) are output from the flip-flops FF of the plurality of word line group decoders WD0, WD1, WD2, WD3, WDn. Accordingly, the word line group decoders WD0 and WD2 corresponding to the address signal AS of the bit value "1" selectively drive the word line WL2 in the set, and the word line group decoders WD1, WD3, and WDn corresponding to the address signal AS of the bit value "0" selectively drive the word line WL3 in the set. As a result, for example, in a third period, the operations of the plurality of word line group decoders WD0 to WDn as illustrated in FIG. 10A can be executed. FIG. 10 is a diagram illustrating the operations of the plurality of word line group decoders WD0 to WDn.

Figure 9B:
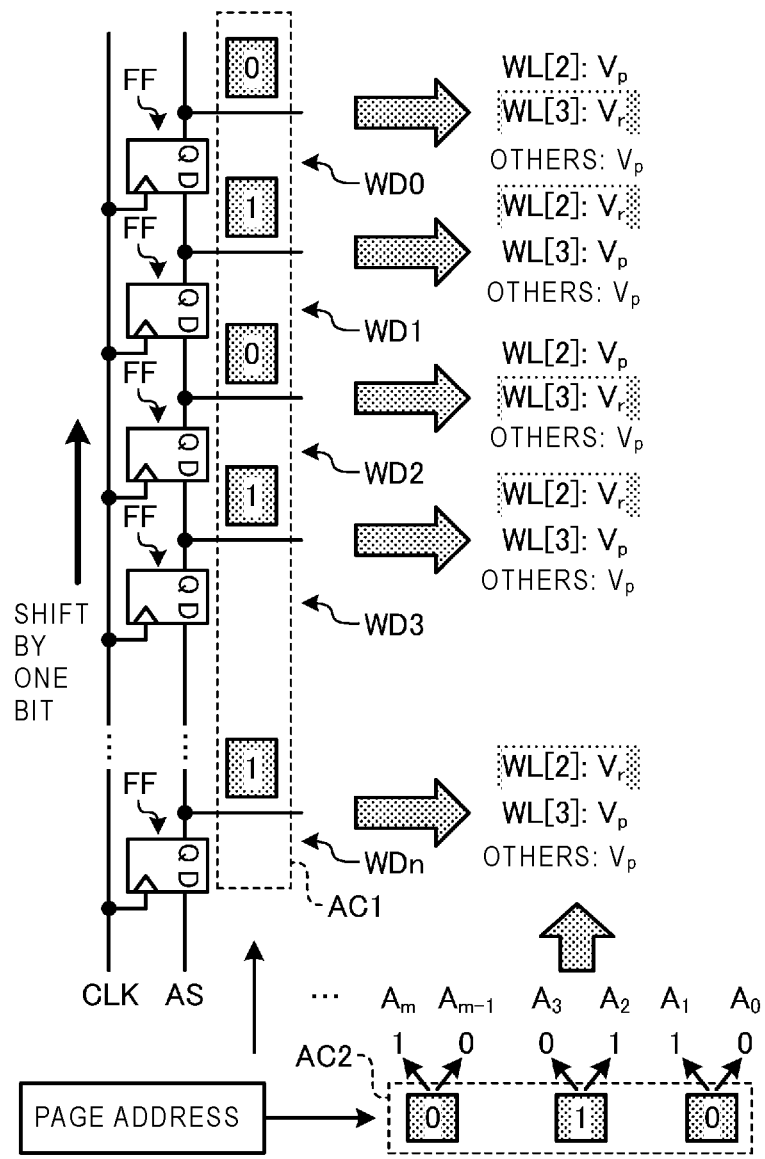
Figure 10B:
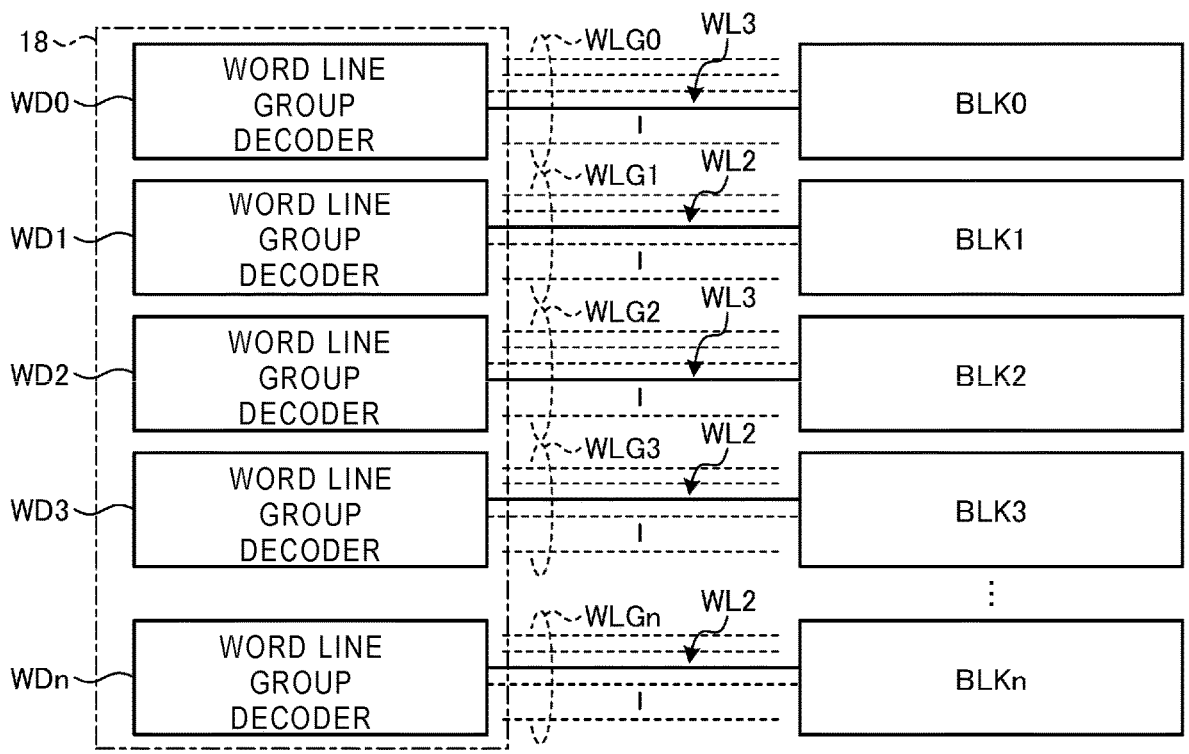

When the address signal AS is shifted by one bit between the flip-flops FF of the plurality of word line group decoders WD0 to WDn in synchronization with the clock signal CLK, the state illustrated in FIG. 9A can be transited to a state illustrated in FIG. 9B. FIG. 9B illustrates a state in which the address signals $(AS_0, AS_1, AS_2, AS_3, \ldots, AS_n)$=(0, 1, 0, 1, ..., 1) are output from the flip-flops FF of the plurality of word line group decoders WD0, WD1, WD2, WD3, WDn. Accordingly, the word line group decoders WD1, WD3, and WDn corresponding to the address signal AS of the bit value "1" selectively drive the word line WL2 in the set, and the word line group decoders WD0 and WD2 corresponding to the address signal AS of the bit value "0" selectively drive the word line WL3 in the set. As a result, for example, in a fourth period, the operations of the plurality of word line group decoders WD0 to WDn as illustrated in FIG. 10B can be executed.

As described above, in the present embodiment, in the semiconductor storage device 10, the row decoder 18 includes the plurality of word line group decoders WD. Each of the plurality of word line group decoders WD can selectively drive a word line WL different from a corresponding word line in the word line group WLG when the plurality of word line groups WLG are activated in parallel. For example, when the plurality of word line groups WLG are activated in parallel, the plurality of word line group decoders WD can select a set of corresponding word lines WL in the word line group WLG, and make the word line WL selectively driven within the set different. Accordingly, the flexibility in controlling the memory cell array 11 can be improved, and the memory cell array 11 can be appropriately controlled depending on the contents of the command for the semiconductor storage device 10.

Figure 11:
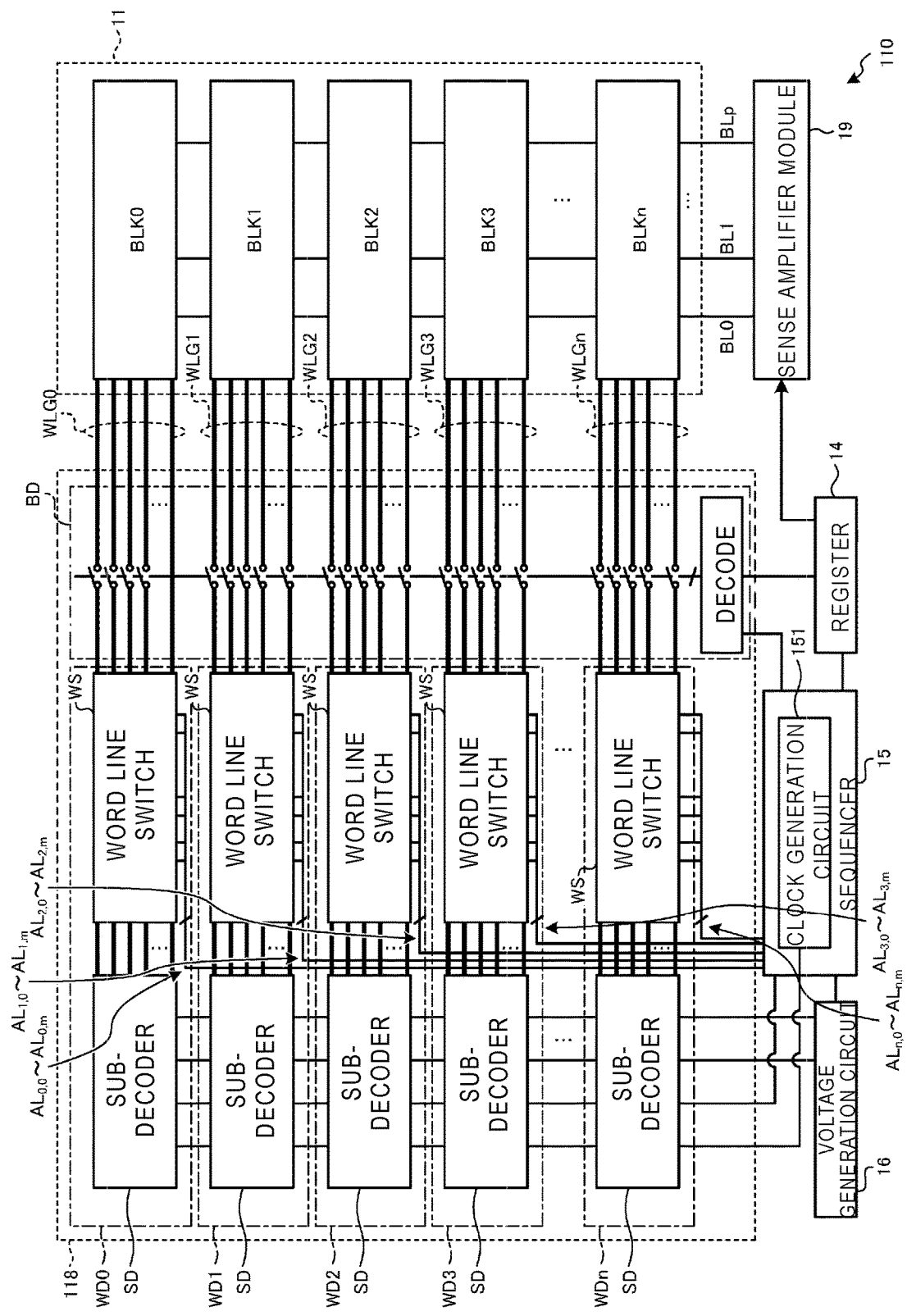
FIG. 11 is a diagram illustrating a configuration of a row decoder and a memory cell array according to a modification of the embodiment.

As illustrated in FIG. 11, in a row decoder 118 of a semiconductor storage device 110, the plurality of word line group decoders WD may be configured to select sets of different word lines WL in the word line groups WLG. FIG. 11 is a diagram illustrating a configuration of the row decoder 118 and the memory cell array 11 according to a modification of the embodiment.

The word line switch circuits WS of the plurality of word line group decoders WD0 to WDn are connected to the sequencer 15 via individual address lines $AL_{0,\,0}$ to $AL_{0,\,m}$, $AL_{1,\,0}$ to $AL_{1,\,m}, \ldots, AL_{n,\,0}$ to $AL_{n,\,m}$ instead of the common address lines $AL_0$ to $AL_m$ (see FIG. 2). For example, the word line switch circuit WS of the word line group decoder WD0 is connected to the sequencer 15 via the plurality of address lines $AL_{0,\,0}$ to $AL_{0,\,m}$. The word line switch circuit WS of the word line group decoder WDn is connected to the sequencer 15 via the plurality of address lines $AL_{n,\,0}$ to $AL_{n,\,m}$.

In this case, in the second mode, the sequencer 15 generates the address code AC1 and a plurality of address codes AC2_0 to AC2_n according to the page address. The sequencer 15 performs the first conversion on the plurality of address codes AC2_0 to AC2_n, generates a plurality of sets of address signal groups $(A_{0,\,0}$ to $A_{0,\,m})$, $(A_{1,\,0}$ to $A_{1, m}$), ..., ($A_{n, 0}$ to $A_{n, m}$), and transfers the plurality of sets of address signal groups ($A_{0, 0}$ to $A_{0, m}$), ($A_{1, 0}$ to $A_{1, m}$), ..., ($A_{n, 0}$ to $A_{n, m}$) to the word line switch circuits WS of the plurality of word line group decoders WD0 to WDn in parallel. Each set of address signal groups includes a plurality of address signals A. For example, the sequencer 15 supplies the plurality of address signals $A_{0, 0}$ to $A_{0, m}$ to the word line group decoder WD0 via the plurality of address lines $AL_{0, 0}$ to $AL_{0, m}$. The sequencer 15 supplies the plurality of address signals $A_{n, 0}$ to $A_{n, m}$ to the word line group decoder WDm via the plurality of address lines $AL_{n, 0}$ to $AL_{n, m}$. Accordingly, in response to the sequencer 15 making the plurality of sets of address signal groups ($A_{0, 0}$ to $A_{0, m}$) to ($A_{n, 0}$ to $A_{n, m}$) different, each word line group decoder WD can select a set of different word lines WL among the plurality of word lines WL0 to WLm in the word line group WLG. A point that each word line group decoder WD selectively drives the word line WL in the set is the same as that of the embodiment.

Figure 12A:
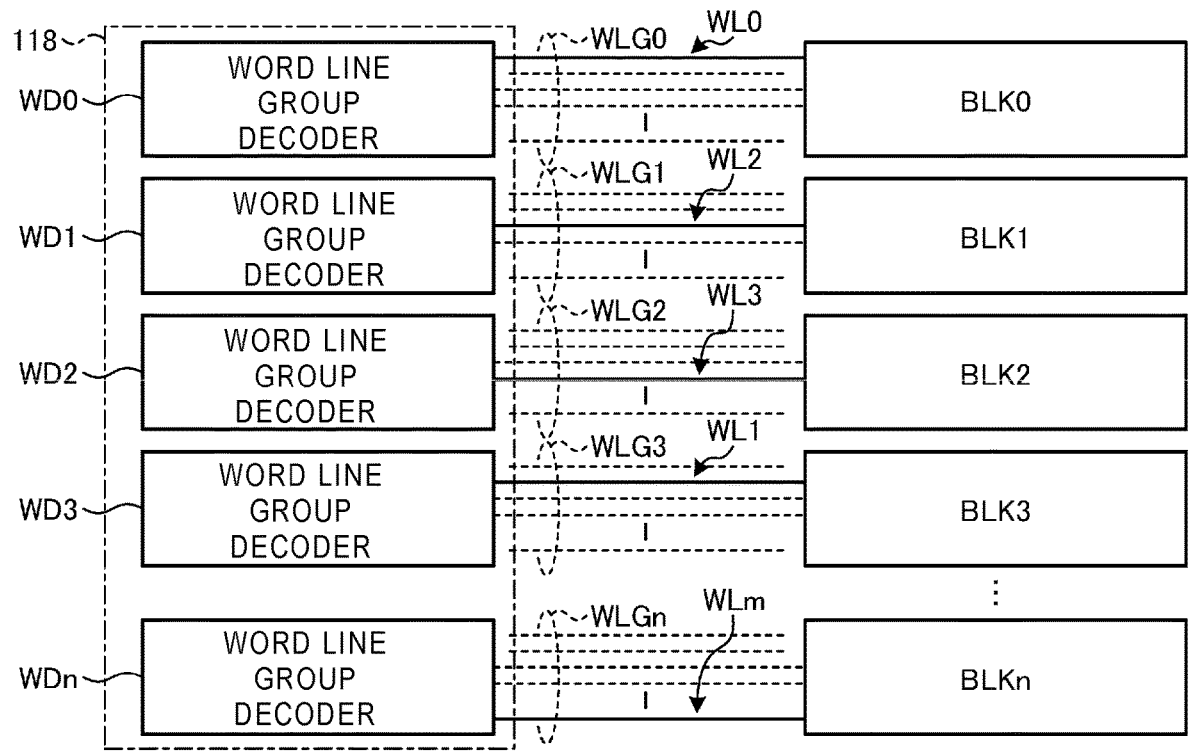
FIGS. 12A and 12B are diagrams illustrating operations of a plurality of word line group decoders according to the modification of the embodiment.
Figure 12B:
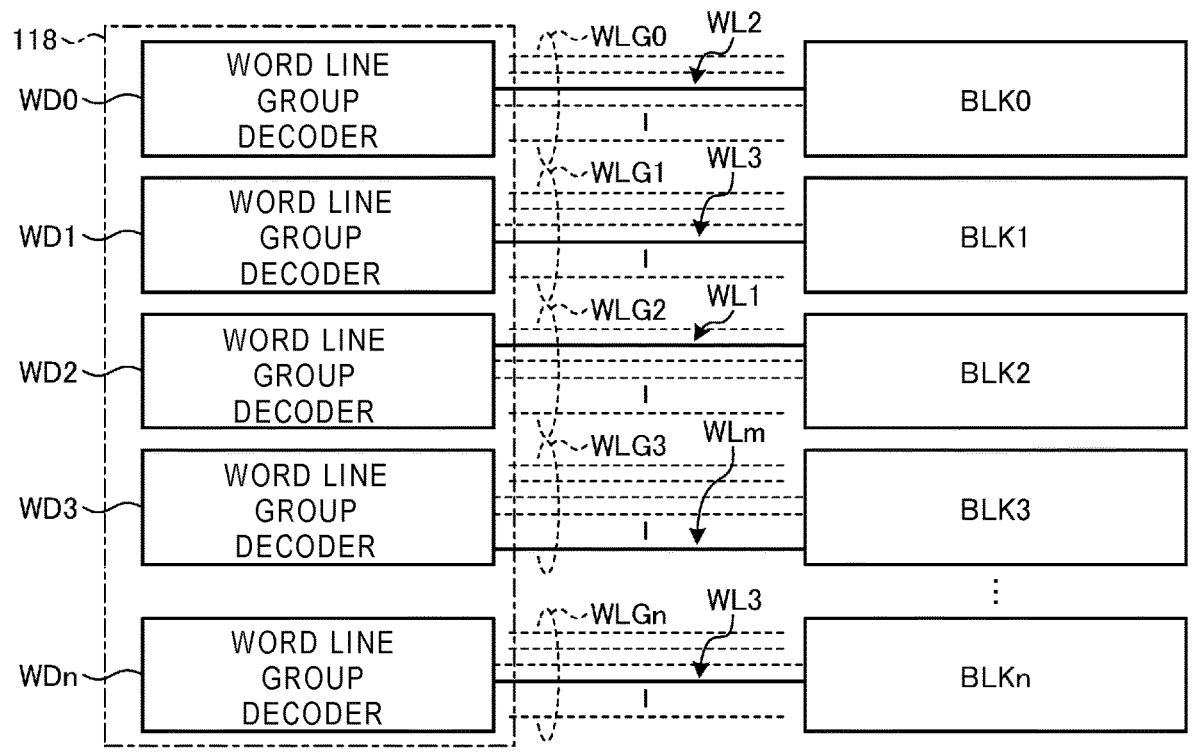

For example, in a fifth period, the row decoder 118 can operate as illustrated in FIG. 12A. FIGS. 12A and 12B are diagrams illustrating operations of the plurality of word line group decoders WD0 to WDn according to the modification of the embodiment. The word line group decoder WD0 among the plurality of word line group decoders WD0 to WDn selects the set of the word lines WL0 and WL1 to selectively drive the word line WL0, applies the selected voltage Vr to the word line WL0, and applies the non-selected voltages Vp to the remaining word lines WL1 to WLm. The word line group decoder WD1 selects the set of the word lines WL2 and WL3 to selectively drive the word line WL2, applies the selected voltage Vr to the word line WL2, and applies the non-selected voltages Vp to the remaining word lines WL0, WL1, and WL3 to WLm. The word line group decoder WD2 selects the set of the word lines WL2 and WL3 to selectively drive the word line WL3, applies the selected voltage Vr to the word line WL3, and applies the non-selected voltages Vp to the remaining word lines WL0 to WL2 and WL4 to WLm. The word line group decoder WD3 selects the set of the word lines WL0 and WL1 to selectively drive the word line WL1, applies the selected voltage Vr to the word line WL1, and applies the non-selected voltages Vp to the remaining word lines WL0 and WL2 to WLm. The word line group decoder WDn selects a set of the word lines WL(m−1) and WLm to selectively drive the word line WLm, applies the selected voltage Vr to the word line WLm, and applies the non-selected voltages Vp to the remaining word lines WL0 to WL(m−1).

In a sixth period, the row decoder 118 can operate as illustrated in FIG. 12B. The word line group decoder WD0 among the plurality of word line group decoders WD0 to WDn selects the set of the word lines WL2 and WL3 to selectively drive the word line WL2, applies the selected voltage Vr to the word line WL2, and applies the non-selected voltages Vp to the remaining word lines WL0, WL1, and WL3 to WLm. The word line group decoder WD1 selects the set of the word lines WL2 and WL3 to selectively drive the word line WL3, applies the selected voltage Vr to the word line WL3, and applies the non-selected voltages Vp to the remaining word lines WL0 to WL2 and WL4 to WLm. The word line group decoder WD2 selects the set of the word lines WL0 and WL1 to selectively drive the word line WL1, applies the selected voltage Vr to the word line WL1, and applies the non-selected voltages Vp to the remaining word lines WL0 and WL2 to WLm. The word line group decoder WD3 selects the set of the word lines WL(m−1) and WLm to selectively drive the word line WLm, applies the selected voltage Vr to the word line WLm, and applies the non-selected voltages Vp to the remaining word lines WL0 to WL(m−1). The word line group decoder WDn selects the set of the word lines WL2 and WL3 to selectively drive the word line WL3, applies the selected voltage Vr to the word line WL3, and applies the non-selected voltages Vp to the remaining word lines WL0 to WL2 and WL4 to WLm.

That is, the row decoder 118 can select different sets of the word lines among the plurality of word line groups WLG0 to WLGn when the plurality of word line groups WLG0 to WLGn are activated in parallel. Accordingly, the flexibility in controlling the memory cell array 11 can be further improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a memory cell array including a plurality of word line groups and a plurality of blocks corresponding to the plurality of word line groups, each of word line groups including a plurality of word lines and each of the blocks including a plurality of memory cells, the plurality of memory cells of each block being connected to the respective word lines of a corresponding one of the word line groups; and
   a row decoder including a plurality of word line group decoders corresponding to the plurality of word line groups, respectively, wherein
   each of the plurality of word line group decoders is configured to drive a word line independent from a word line driven in another of the word line groups, when all of the plurality of word line groups are activated in parallel.

2. The semiconductor storage device according to claim 1, wherein
   the plurality of word line groups include a first word line group and a second word line group,
   a plurality of word lines included in the first word line group correspond to a plurality of word lines included in the second word line group, respectively,
   the plurality of word line group decoders include:
      a first decoder corresponding to the first word line group; and
      a second decoder corresponding to the second word line group,
   the first decoder is configured to apply a selected voltage to a first word line among the plurality of word lines included in the first word line group, and apply non-selected voltages to remaining word lines, and
   the second decoder is configured to apply the selected voltage to a third word line adjacent to a second word line corresponding to the first word line among the plurality of word lines included in the second word line group, and apply the non-selected voltages to the second word line and remaining word lines.

3. The semiconductor storage device according to claim 1, wherein the plurality of word line groups include a first word line group and a second word line group, a plurality of word lines included in the first word line group correspond to a plurality of word lines included in the second word line group, respectively, the plurality of word line group decoders include:
  a first decoder corresponding to the first word line group; and
  a second decoder corresponding to the second word line group, the first decoder is configured to apply a selected voltage to a first word line among the plurality of word lines included in the first word line group, and apply non-selected voltages to remaining word lines, and the second decoder is configured to apply the selected voltage to a third word line different from a second word line corresponding to the first word line among the plurality of word lines included in the second word line group, and apply the non-selected voltages to the second word line and remaining word lines.

4. The semiconductor storage device according to claim 1, wherein
the word line group decoder includes:
  a sub-decoder circuit; and
  a word line switch circuit connected between the sub-decoder circuit and the word line group.

5. The semiconductor storage device according to claim 4, wherein
the sub-decoder circuit includes:
  a first voltage line to which a selected voltage is transmitted; and
  a second voltage line to which a non-selected voltage is transmitted,
the word line switch circuit includes a first signal line and a second signal line,
the sub-decoder circuit further includes:
  a first switching circuit configured to switch between a first connection state and a second connection state, the first connection state being a state in which the first voltage line is connected to the first signal line and the second voltage line is connected to the second signal line, the second connection state being a state in which the first voltage line is connected to the second signal line and the second voltage line is connected to the first signal line, and
the word line switch circuit further includes:
  a second switching circuit that corresponds to an even-numbered first word line among the plurality of word lines of the word line group, and is configured to switch between a third connection state in which the first signal line is connected to the first word line and a fourth connection state in which the second voltage line is connected to the first word line; and
  a third switching circuit that corresponds to an odd-numbered second word line among the plurality of word lines of the word line group, and is configured to switch between a fifth connection state in which the second signal line is connected to the second word line and a sixth connection state in which the second voltage line is connected to the second word line.

6. A method, comprising:
providing a memory cell array including a plurality of word line groups and a plurality of blocks corresponding to the plurality of word line groups, each of word line groups including a plurality of word lines and each of the blocks including a plurality of memory cells, the plurality of memory cells of each block being connected to the respective word lines of a corresponding one of the word line groups;
operatively coupling a plurality of word line group decoders to the plurality of word line groups, respectively; and
driving a first word line in one of the word line groups independent from a second word line driven in another of the word line groups, when all of the plurality of word line groups are activated in parallel.

7. A semiconductor storage device, comprising:
a memory cell array including a plurality of word line groups and a plurality of blocks corresponding to the plurality of word line groups, each of word line groups including a plurality of word lines and each of the blocks including a plurality of memory cells, the plurality of memory cells of each block being connected to the respective word lines of a corresponding one of the word line groups; and
a plurality of word line group decoders corresponding to the plurality of word line groups, respectively, each of the word line group decoders further including a sub-decoder circuit and a word line switch circuit connected between the sub-decoder circuit and the corresponding word line group, wherein
each of the plurality of word line group decoders is configured to drive a word line different from a word line driven in another of the word line groups, when all of the plurality of word line groups are activated in parallel.

* * * * *